United States Patent
Tsai et al.

(10) Patent No.: US 10,453,818 B2
(45) Date of Patent: Oct. 22, 2019

(54) PACKAGING STRUCTURES OF INTEGRATED CIRCUITS

(71) Applicant: Taiwan Semiconductor Manufacturing Company, Ltd., Hsinchu (TW)

(72) Inventors: Tsung-Fu Tsai, Changhua (TW); Chia-Wei Tu, Chunan Town (TW); Yian-Liang Kuo, Hsinchu (TW); Ru-Ying Huang, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/881,022

(22) Filed: Jan. 26, 2018

(65) Prior Publication Data

US 2018/0151528 A1    May 31, 2018

Related U.S. Application Data

(62) Division of application No. 13/253,799, filed on Oct. 5, 2011, now abandoned.

(51) Int. Cl.
*H01L 23/00* (2006.01)
*H01L 23/48* (2006.01)
(Continued)

(52) U.S. Cl.
CPC ............ *H01L 24/14* (2013.01); *H01L 23/562* (2013.01); *H01L 23/585* (2013.01);
(Continued)

(58) Field of Classification Search
CPC ......... H01L 24/03; H01L 24/06; H01L 24/17; H01L 24/97; H01L 24/05; H01L 24/09; H01L 24/13; H01L 24/16; H01L 24/19; H01L 24/80; H01L 24/81; H01L 24/92; H01L 24/14; H01L 23/3128;
(Continued)

(56) References Cited

U.S. PATENT DOCUMENTS 6,448,639 B1    9/2002   Ma
6,462,420 B2   10/2002   Hikita et al.
(Continued)

OTHER PUBLICATIONS

Lee, M. W., et al., "Below 45nm Low-k Layer Stress Minimization Guide for High-Performance Flip-Chip Packages with Copper Pillar Bumping," Electronic Components and Technology Conference, Las Vegas, NV, Jun. 2010, IEEE, pp. 1623-1630.

*Primary Examiner* — Natalia A Gondarenko
(74) *Attorney, Agent, or Firm* — Slater Matsil, LLP (57) ABSTRACT

A chip includes a first group of dummy bumps disposed at a top surface of the chip in a first corner of the chip, a second group of dummy bumps disposed at the top surface of the chip in a second corner of the chip, and active bump connectors disposed at the top surface of the chip. The chip also includes an outer seal ring disposed around a periphery of the chip, a first seal ring arrangement disposed around the first group of dummy bumps, and a second seal ring arrangement disposed around the second group of dummy bumps. The first seal ring arrangement and second seal ring arrangement are disposed in dielectric layers underlying the first and second groups of dummy bumps.

20 Claims, 7 Drawing Sheets

(51) Int. Cl.
*H01L 23/522* (2006.01)
*H01L 23/58* (2006.01)
*H01L 25/065* (2006.01)

(52) U.S. Cl.
CPC ........ *H01L 25/0657* (2013.01); *H01L 23/522* (2013.01); *H01L 24/13* (2013.01); *H01L 2224/10126* (2013.01); *H01L 2224/131* (2013.01); *H01L 2224/13082* (2013.01); *H01L 2224/13147* (2013.01); *H01L 2224/13644* (2013.01); *H01L 2224/13655* (2013.01); *H01L 2224/13664* (2013.01); *H01L 2224/17517* (2013.01); *H01L 2225/06513* (2013.01); *H01L 2225/06527* (2013.01); *H01L 2225/06544* (2013.01); *H01L 2924/01322* (2013.01); *H01L 2924/3512* (2013.01)

(58) Field of Classification Search
CPC ......... H01L 23/49816; H01L 23/49827; H01L 23/5226; H01L 23/535; H01L 23/528; H01L 23/5384; H01L 23/5386; H01L 23/562; H01L 23/522; H01L 23/585; H01L 25/0652; H01L 25/0657; H01L 2924/3512; H01L 2924/3511; H01L 2924/35121; H01L 2924/384; H01L 2924/01322; H01L 2933/0033; H01L 2224/13147; H01L 2224/131; H01L 2224/13082; H01L 2224/13644; H01L 2224/13655; H01L 2224/13664; H01L 2224/10126; H01L 2224/17517; H01L 2225/0654; H01L 2225/06513; H01L 2225/06527

USPC .......... 257/37, 738, 773–775, 778–784, 758, 257/786, 621, 632, 685, 741, 737; 438/108, 540, 612, 613, 617, 637, 666, 438/675

See application file for complete search history.

(56) References Cited

U.S. PATENT DOCUMENTS

| | | | |
|---|---|---|---|
| 7,176,555 B1 | 2/2007 | Jao et al. | |
| 7,622,309 B2 | 11/2009 | Su et al. | |
| 7,851,907 B2* | 12/2010 | Hall | H01L 21/563 257/723 |
| 2004/0017008 A1 | 1/2004 | Ueda | |
| 2004/0183205 A1 | 9/2004 | Yamaguchi | |
| 2005/0263855 A1* | 12/2005 | Fu | H01L 23/544 257/620 |
| 2007/0023920 A1 | 2/2007 | Jao et al. | |
| 2007/0152350 A1* | 7/2007 | Kim | H01L 23/3128 257/786 |
| 2008/0073784 A1* | 3/2008 | Lee | H01L 23/3121 257/738 |
| 2009/0315184 A1* | 12/2009 | Tokitoh | H01L 23/522 257/758 |
| 2010/0007030 A1 | 1/2010 | Koike et al. | |
| 2010/0078769 A1 | 4/2010 | West et al. | |
| 2011/0156230 A1 | 6/2011 | Goh | |
| 2012/0139092 A1 | 6/2012 | Su et al. | |

\* cited by examiner

PACKAGING STRUCTURES OF INTEGRATED CIRCUITS

PRIORITY CLAIM AND CROSS-REFERENCE

This application is a division of U.S. application Ser. No. 13/253,799, filed on Oct. 5, 2011, entitled "Packaging Structures of Integrated Circuits," which application is hereby incorporated herein by reference in its entirety.

BACKGROUND

In the packaging of integrated circuits, dies may be packaged onto other package components such as package substrates, interposers, printed circuit boards (PCBs), or the like. The packaging may be performed through flip chip bonding.

Since the coefficients of thermal expansion (CTE) of the dies and the CTEs of different package components may be significantly different from each other, after the flip chip bonding is performed, a significant stress may be generated in the resulting package. The stress may also be applied on the dies and other package components in the respective packages. With the increase in the sizes of the dies and the package components, the stress may be further increased, and hence a more significant problem has been observed in recent manufacturing processes, in which larger dies are used. Typically, the stress is highest at the corners of the dies because the corners have the highest distances to neutral points (DNP). The stress may cause solder cracking, dielectric cracking, and/or delamination between the dielectric layers in the dies, especially when lead-free solder is used in the package. The cracks and the delamination may propagate to other parts of the dies, causing circuit failure.

Various solutions were proposed to solve the problem caused by the high stress. In some solutions, since the corner bumps are most likely to have stresses, the structures adjacent to the corner bumps are enhanced. In some other solutions, the corner bumps are designed as dummy bumps, which are not used for electrical connection. Instead, the dummy corner bumps are used for absorbing the stresses.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A method of improving the reliability of flip chip packages and the respective circuit structures are provided in accordance with embodiments. The variations of the embodiments are discussed. Throughout the various views and illustrative embodiments, like reference numbers are used to designate like elements.

Figure 1:
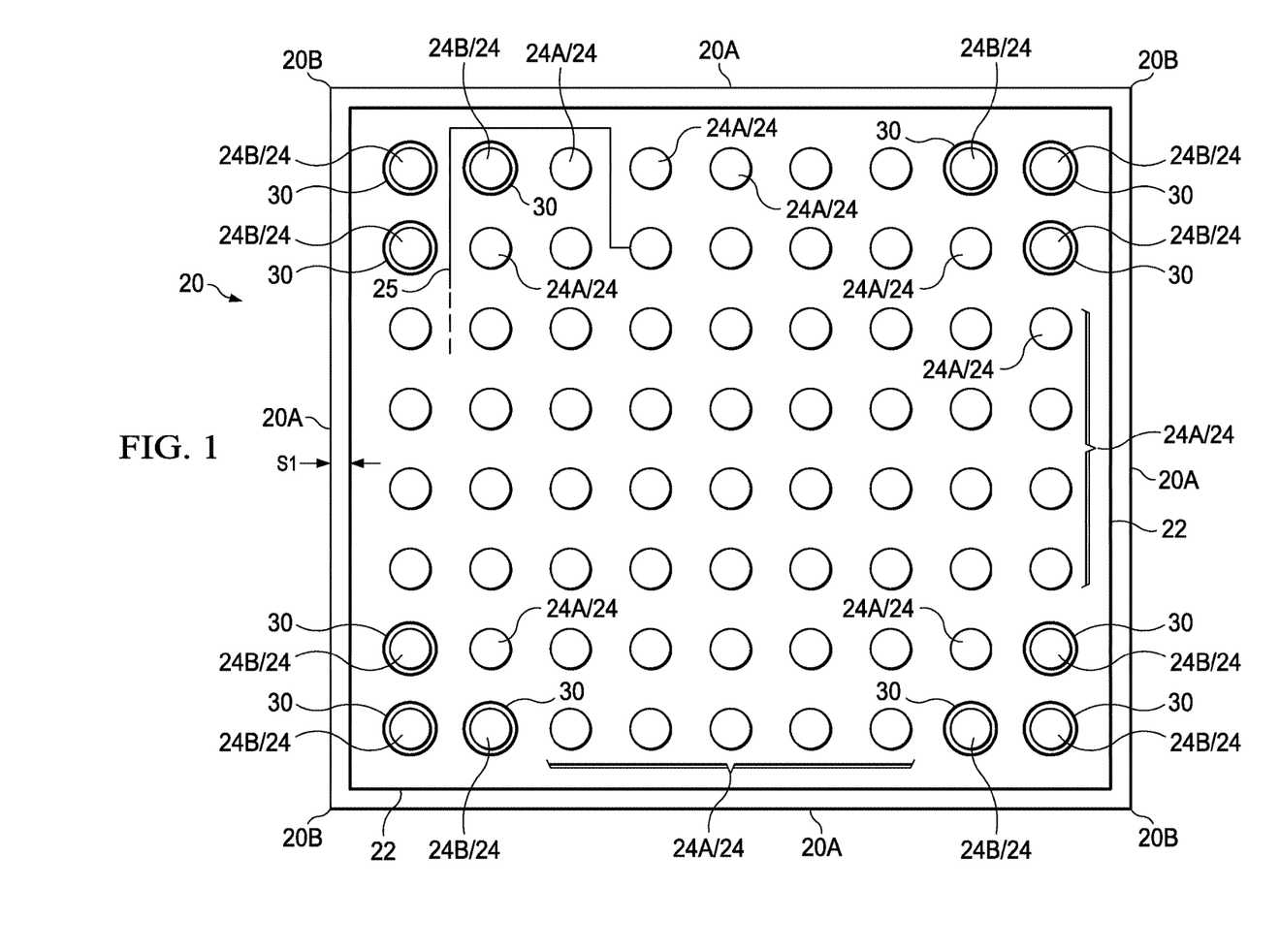
FIGS. 1 through 3 are top views of chips in accordance with various embodiments, wherein protective seal rings are formed to encircle the regions under dummy bumps in order to prevent the propagation of the cracking and delamination in dielectric layers.

FIG. 1 illustrates a top view of chip 20 in accordance with various embodiments, wherein chip 20 may be a device chip including active devices such as transistors therein. Chip 20 may have a rectangular top-view shape, and possibly a square top-view shape. Chip 20 includes edges 20A and corners 20B. Seal ring 22 is disposed at the peripheral regions of chip 20. For example, seal ring 22 may include four sides, with each of the sides adjacent to, and may be parallel to, one of edges 20A of chip 20. The distance S1 between the sides of seal ring 22 and the nearest edges 20A of chip 20 may be smaller than about 100 μm in some embodiments. It is realized, however, that the dimensions recited throughout the description are merely examples, and may be changed to different values. Optionally, there may be a sacrificial seal ring (not shown) formed outside, and encircling, seal ring 22.

A plurality of connectors 24 are disposed at the surface of chip 20, and may be located inside seal ring 22. Connectors 24 may be used to bond to, and electrically connect to, another package component (e.g., package component 70 in FIGS. 6A and 6B) such as a device die, an interposer, a package substrate, a printed circuit board (PCB), or the like. Connectors 24 are alternatively referred to as bumps 24, and may have various forms such as solder balls, copper pillars, solder caps, and/or the like. The bonding between chip 20 and the other package component may be made through active bumps (alternatively referred to as active electrical connectors) 24A and dummy bumps (alternatively referred to as dummy connectors) 24B. Bumps 24 may be distributed as an array, which includes a plurality of rows and columns.

Figure 4:
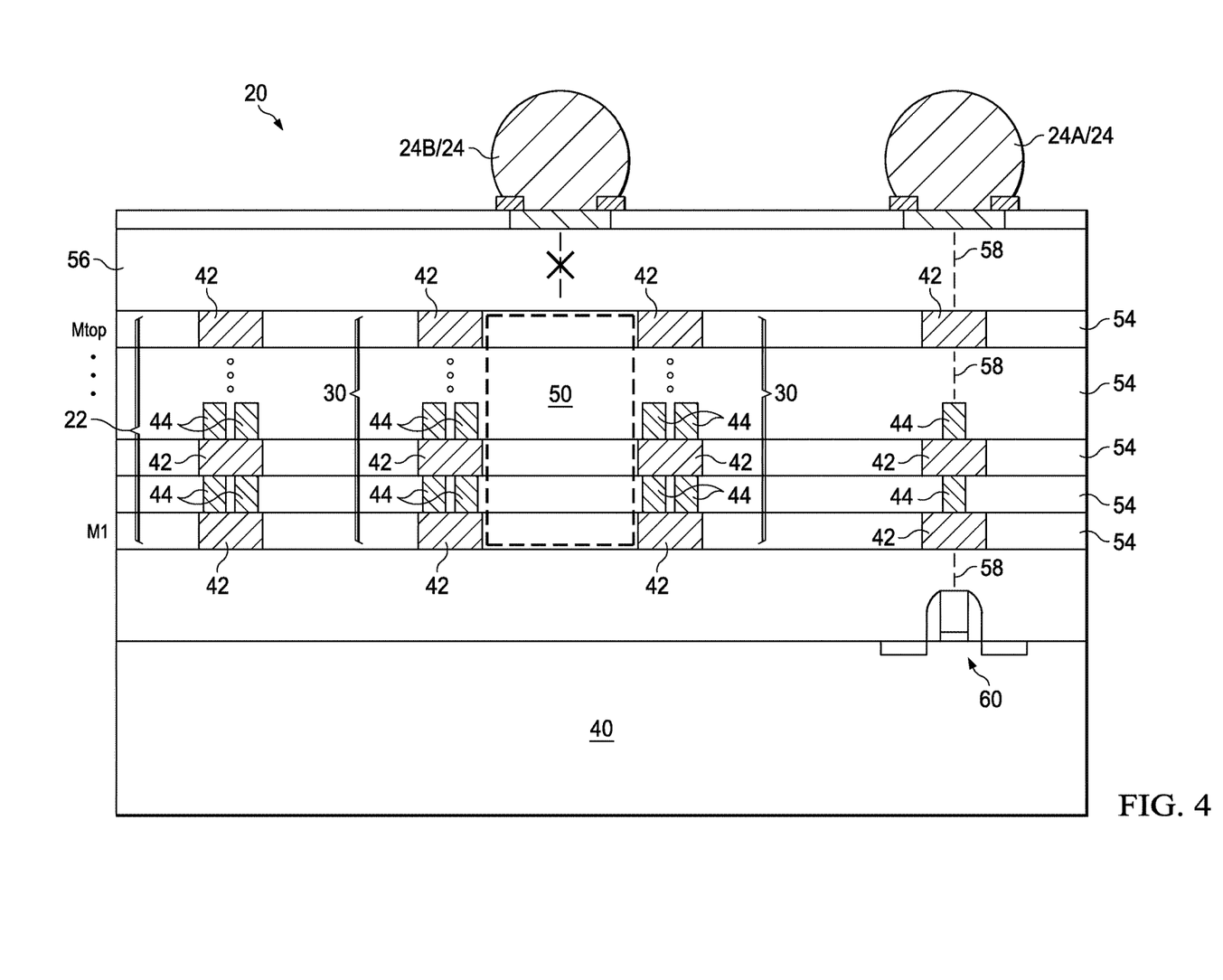
FIGS. 4 and 5 are cross-sectional views of the chip shown in FIGS. 1 through 3.
Figure 5:
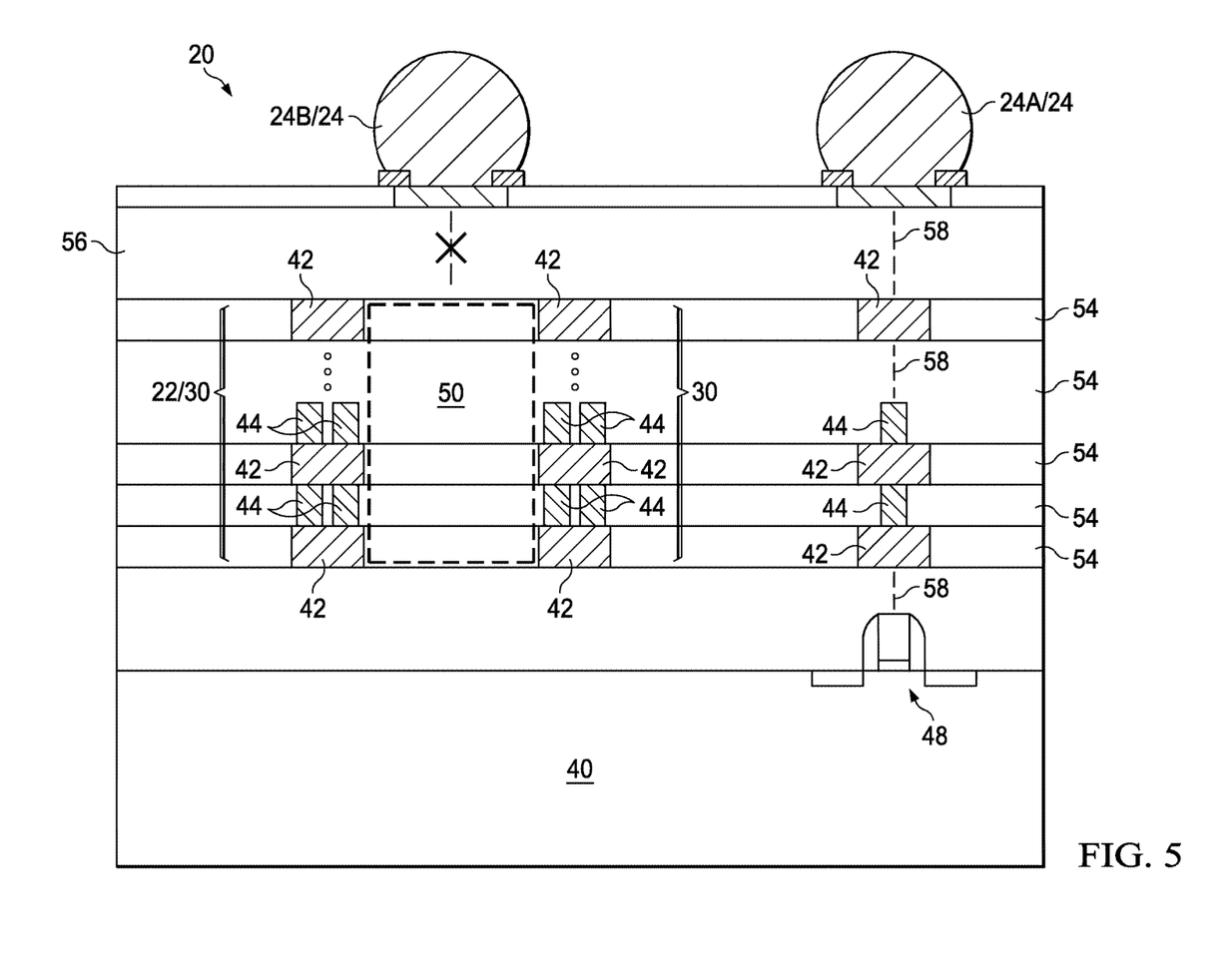

Dummy bumps 24B may be disposed as corner bumps, which are adjacent to corners 20B of chip 20. Depending on the magnitude of the stress applied to the bumps, at each corner 20B, there may be one, two, three, or more dummy bumps. In some embodiments, there may be one or more dummy bumps disposed at the center of chip 20. In an exemplary embodiment, in the top view (as shown in FIG. 1) of chip 20, each of dummy bumps 24B is encircled by one protective seal ring 30, which is formed simultaneously with the formation of seal ring 22. Throughout the description, when a dummy bump is referred to as being "encircled" by a protective seal ring, it indicates that a region directly under the dummy bump (please refer to FIGS. 4 and 5) is encircled by the protective seal ring, although in the cross-sectional views such as what are shown in FIGS. 4 and 5, protective seal rings 30 are actually disposed under the respective dummy bumps 24B. Protective seal rings 30 may be electrically and/or physically disconnected from, although they may be connected to, seal ring 22. Protective seal rings 30 and seal ring 22 may be formed simultaneously in the same process steps. Accordingly, protective seal rings 30 and seal ring 22 extend into the same layers (which may be low-k dielectric layers) of chip 20. In an embodiment, none of active bumps 24A in chip 20 is encircled (viewed in the top view) by any protective seal ring(s) 30. In alternative embodiments, some of active bumps 24A in chip 20 may be encircled (viewed in the top view) by protective seal ring(s) 30.

Figure 2:
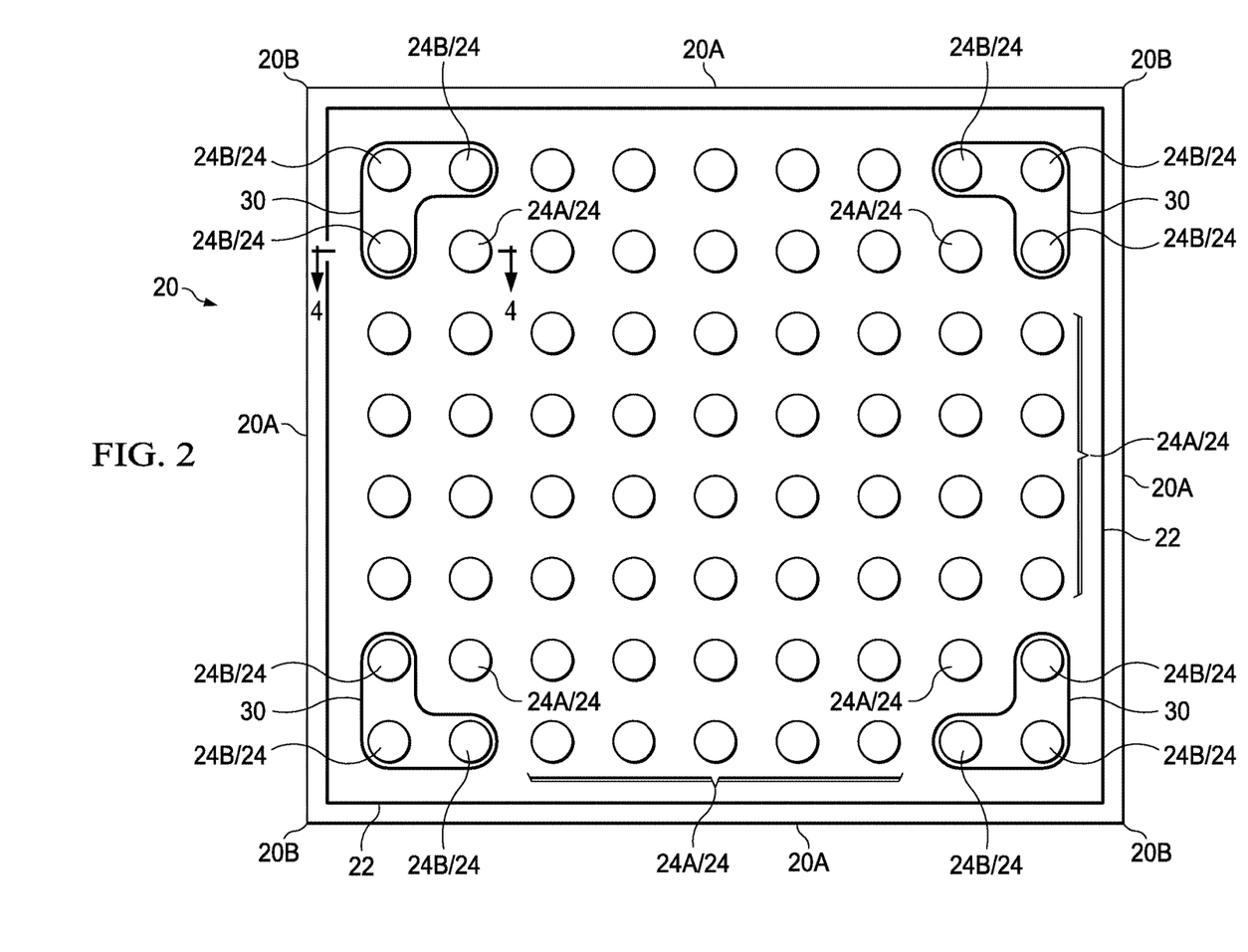

FIG. 2 illustrates an alternative embodiment similar to the embodiment shown in FIG. 1, except two or more dummy bumps 24B are encircled by a same protective seal ring 30. In accordance with some embodiments, one protective seal ring 30 may be formed to encircle all dummy bumps 24B that are adjacent to the same corner 20B, although more than one protective seal ring 30 may be formed adjacent to the same corner 20B in alternative embodiments. In addition, in these embodiments, the protective seal ring 30 that encircles two or more dummy bumps 24B may not encircle any active bump 24A therein.

Figure 3:
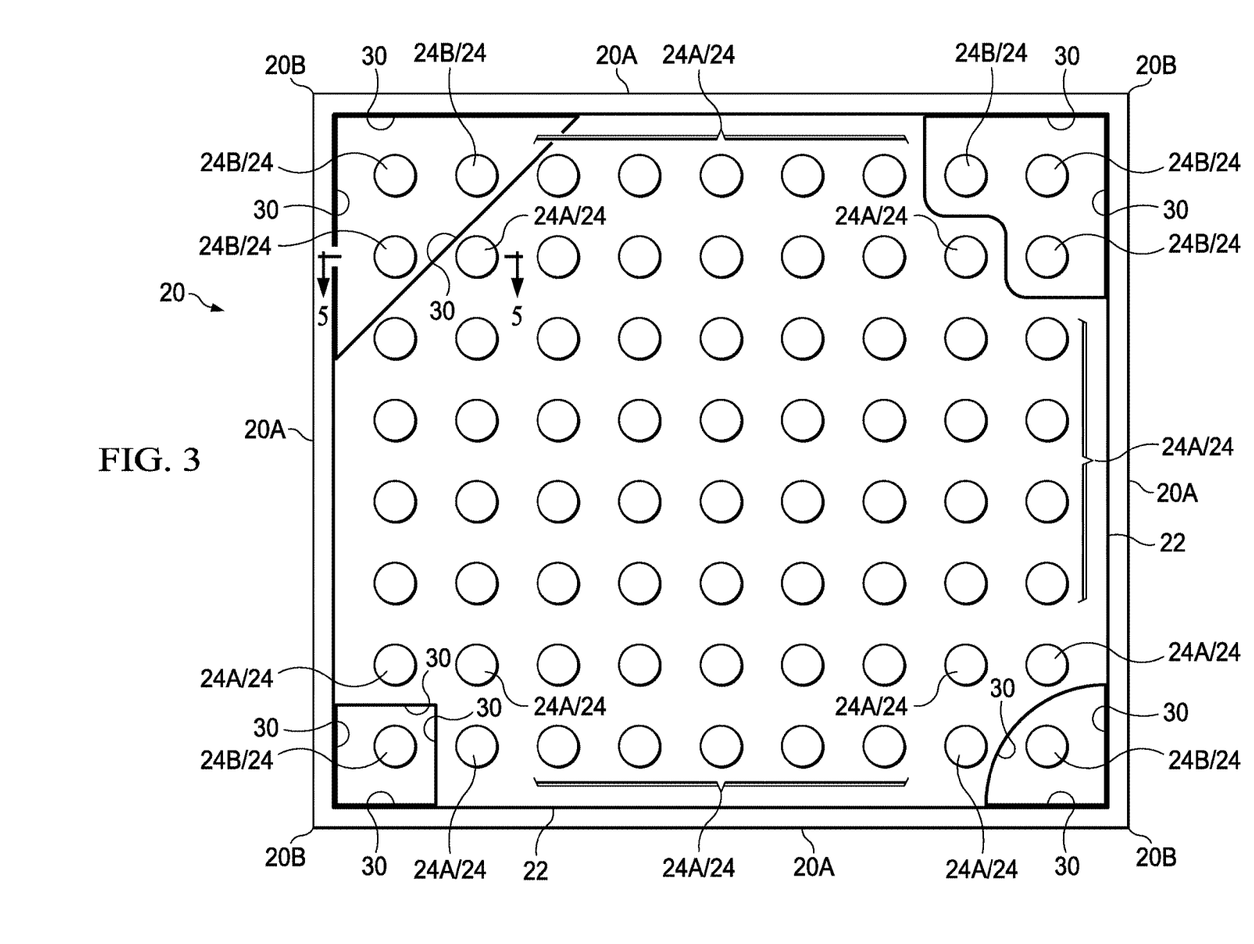

FIG. 3 illustrates yet another embodiment, wherein protective seal ring 30 and seal ring 22 may share a common portion. Protective seal ring 30 thus may include a first portion shared with seal ring 22, and an additional portion not shared with seal ring 22. The additional portion not shared with seal ring 22 may be encircled by seal ring 22. In these embodiments, protective seal ring 30 may encircle a single dummy bump 24B, or a plurality of neighboring dummy bumps 24. FIG. 3 illustrates various possible schemes for forming protective seal rings 30 at different corners of chip 20. It is realized that each of the schemes may be used at all corners of a same chip, or different schemes may be disposed in a same chip in a mixed fashion.

The embodiments shown in FIGS. 1 through 3 may be adopted on a same chip. For example, in the chip, a first protective seal ring 30 may encircle a single dummy bump 24B (FIG. 1), while a second protective seal ring 30 in the chip may encircle two or more dummy bumps 24B. A third protective seal ring 30 in the chip, on the other hand, may be formed using the scheme shown in FIG. 3.

In the embodiments shown in FIG. 1, since protective seal rings 30 encircling individual dummy bumps 24B are separated from each other, and are possibly separated from seal ring 22, the spaces between neighboring protective seal rings 30, and the spaces between protective seal rings 30 and seal ring 22 may be used for routing metal lines, which may be disposed in low-k dielectric layers. Line 25 represents an exemplary metal line routed between dummy bumps 24B (please also refer to metal lines 42 and dielectric layers 54 in FIGS. 4 and 5). On the other hand, in the embodiments in FIGS. 2 and 3, the spaces between neighboring dummy bumps 24B, and between dummy bumps 24B and seal ring 22, are also encircled by protective seal ring 30, and may not be used for routing metal lines. The design and the placement of the protective rings thus need to take these factors into consideration.

FIGS. 4 and 5 illustrate cross-sectional views of portions of chip 20, wherein the cross-sectional views are retrieved from the plane crossing line 4-4 in FIG. 2 and the plane crossing line 5-5 in FIG. 3, respectively. Chip 20 may include semiconductor substrate 40, which may be a silicon substrate, or may be formed of other semiconductor materials such as silicon carbon, silicon germanium, III-V compound semiconductor materials, or the like. Each of seal ring 22 and protective seal rings 30 includes a plurality of metal lines 42 and vias 44 formed in dielectric layers 54. As shown in FIGS. 4 and 5, each section of the plurality of metal lines can be coupled to another section of the plurality of metal lines by two vias per section. In each of protective seal rings 30, at least some, and possibly each, of metal lines 42 and vias 44 may form a ring encircling region 50, which region is directly underlying and overlapping the respective dummy bump 24B. Accordingly, each of protective seal rings 30 encircles region 50 that is directly underlying the respective dummy bump 24B. From the top view, dummy bump 24B thus appears as being encircled by the respective protective seal ring 30.

Metal lines 42 and vias 44 are formed in dielectric layers 54. The dielectric constants (k values) of dielectric layers 54 may be lower than about 3.0, or lower than about 2.5, hence dielectric layer 54 may be referred to as low-k dielectric layers. The bottom metal lines 42 (in the bottom metal layer, commonly known as M1) may be formed using a single damascene process, while upper metal lines 42 may be formed along with the underlying vias 44 using dual damascene processes. The top metal layer Mtop may be formed in a low-k dielectric layer, while an overlying dielectric layer 56 immediately over the top metal layer Mtop may be formed of a non-low-k dielectric layer, and may be referred to as a passivation layer.

Seal ring 22 and protective seal rings 30 may be formed simultaneously using lithography, polish, and deposition processes, and may be formed using the same lithography masks. Accordingly, seal ring 22 and protective seal rings 30 extend into the same layers (such as metal layers M1 through Mtop) of chip 20. In some embodiments, seal ring 22 and protective seal rings 30 extend from bottom metal layer M1 into top metal layer Mtop, and does not extend into passivation layer 56. Accordingly, seal ring 22 and protective seal rings 30 may be copper-containing features. In alternative embodiments, seal ring 22 and protective seal rings 30 may also extend into passivation layers 56 that are formed of non-low-k dielectric materials. Accordingly, in accordance with some embodiments, seal ring 22 and protective seal rings 30 may include aluminum-containing features that include aluminum copper, for example.

Figure 6A:
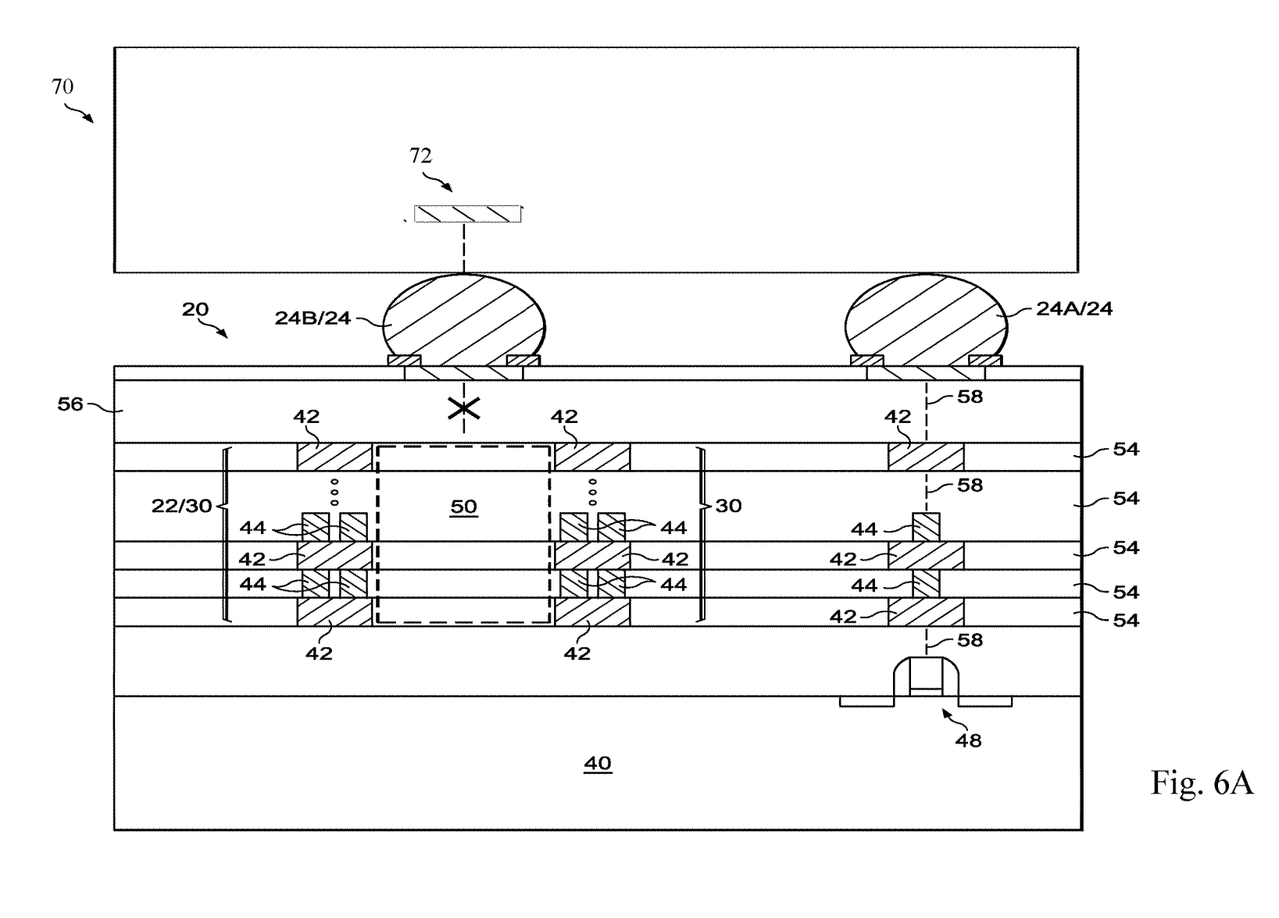
FIGS. 6A and 6B are cross-sectional views of the chip shown in FIGS. 1 through 3 connected to another package component.
Figure 6B:
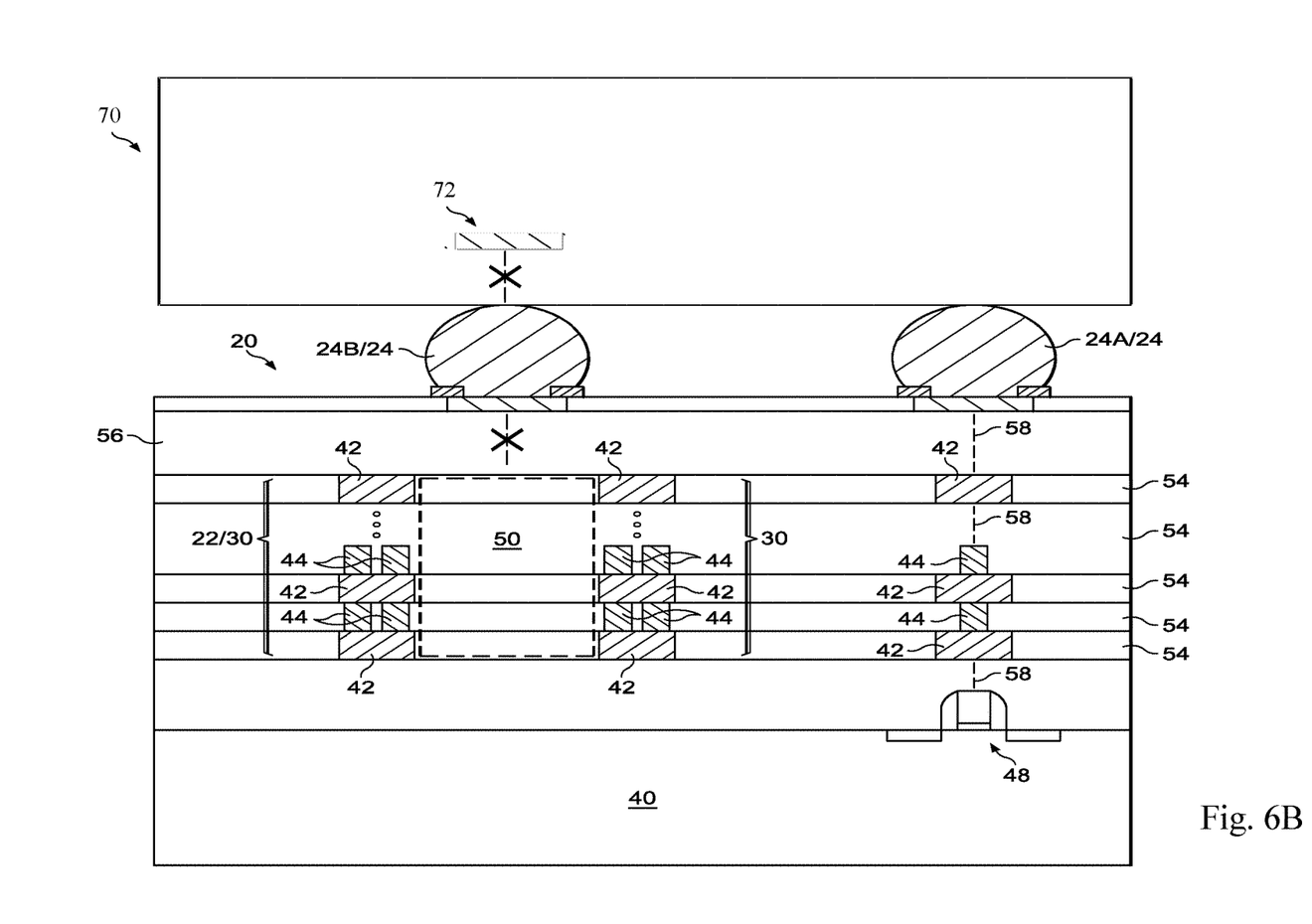

As shown in FIGS. 4 and 5, active bumps 24A and dummy bumps 24B may have essentially the same structure and/or size, although they may also have different structures and/or sizes. In some embodiments, active bumps 24A and dummy bumps 24B are solder balls. In alternative embodiments, active bumps 24A and dummy bumps 24B may include copper pillars and solder caps formed on the copper pillars. In addition, additional layers such as a palladium layer, a gold layer, a nickel layer, or the like, may be incorporated in each of active bumps 24A and dummy bumps 24B. Active bumps 24A have electrical functions, and may be electrically coupled to metal lines, vias, active devices 60 (which may be transistors), and the like, inside chip 20. Dashed lines 58, metal lines 42, and via 44 symbolize the electrical coupling. On the other hand, dummy bump 24B does not have electrical functions, and may not be electrically coupled to any active devices such as transistors inside chip 20. An "x" sign is shown in FIG. 4 to indicate the electrical decoupling of dummy bump 24B from other devices in chip 20. The solder used in bumps 24 may be a lead-free solder, although it may be formed of other types of solders such as a eutectic solder. Furthermore, when chip 20 is bonded to another package component (e.g., package component 70 in FIGS. 6A and 6B) such as another device die, an interposer, a package substrate, a PCB, or the like, dummy bumps 24B may, or may not, be electrically coupled to other devices, metal lines, and/or vias in the other package component. For example, FIG. 6A illustrates dummy bumps 24B electrically coupled to a feature 72 (shown as a box to designate another device, metal lines, and/or vias) in another package component 70. As another example, FIG. 6B illustrates dummy bumps 24B electrically decoupled (as indicated by an "x sign") to feature 72 (shown as a box to designate another device, metal lines, and/or vias) in another package component 70.

Since dummy bumps 24B are disposed where the stresses are high, delamination and cracking may still occur to the dielectric materials (which may be low-k dielectric materials) that are directly underlying dummy bumps 24B. For example, as shown in FIG. 4, cracking or delamination may occur in region 50. If the cracking or delamination occurs in region 50, the cracking or delamination will be blocked by the respective protective seal ring 30, and will not propagate to other regions in chip 20. The reliability of the resulting package is thus improved. It is observed that since protective seal rings 30 and the respective seal ring(s) 22 in the same chip are formed simultaneously, there is no additional manufacturing cost.

In accordance with embodiments, a chip includes a dummy connector disposed at a top surface of the chip. A protective seal ring encircles a region directly underlying the dummy connector, with the region overlapping the dummy connector.

In accordance with other embodiments, a chip includes a seal ring disposed in peripheral regions of the chip, wherein the peripheral regions are adjacent to edges of the chip. A plurality of dummy connectors is disposed at a top surface of the chip and adjacent to the seal ring. A plurality of active electrical connectors is disposed at the top surface of the chip. A plurality of protective seal rings is disposed in the chip, wherein each of the protective seal rings encircles a region directly underlying one of the plurality of dummy connectors. The plurality of protective seal rings is separated from each other. The plurality of protective seal rings may further be separated from the seal ring.

In accordance with yet other embodiments, a chip includes a seal ring disposed in peripheral regions of the chip, wherein the peripheral regions are adjacent to edges of the chip. A dummy connector is disposed at a top surface of the chip. The dummy connector is further adjacent to a corner of the chip. A protective seal ring encircles a region directly under the dummy connector. The protective seal ring and the seal ring share a common portion, which may be a corner portion of the seal ring.

One embodiment is a device including a chip, the chip including: a first group of dummy bumps including a plurality of dummy bump connectors, the first group of dummy bumps being disposed at a top surface of the chip in a first corner of the chip, where the first corner is disposed immediately adjacent two intersecting edges of the chip. The chip includes a second group of dummy bumps including one or more dummy bump connectors, where the second group of dummy bumps is disposed at the top surface of the chip in a second corner of the chip, and where the second corner is disposed immediately adjacent two intersecting edges of the chip. The first and second groups of dummy bumps are disposed in different corners of the chip. The chip further includes a plurality of active bump connectors disposed at the top surface of the chip, where the plurality of active bump connectors and the first and second groups of dummy bumps are arranged in a pattern in a top down view of the chip. The chip also includes an outer seal ring disposed around a periphery of the chip, a first seal ring arrangement disposed around the first group of dummy bumps, and a second seal ring arrangement disposed around the second group of dummy bumps. The chip further includes dielectric layers underlying the first and second groups of dummy bumps and the plurality of active bump connectors. The first seal ring arrangement is disposed in the dielectric layers, the first seal ring arrangement encircling all of the first group of dummy bumps in top down view such that the first group of dummy bumps are disposed within a single continuous seal ring structure. The second seal ring arrangement is disposed in the dielectric layers, the second seal ring arrangement encircling each dummy bump connector of the second group of dummy bumps in top down view such that each dummy bump is individually disposed within a corresponding separate seal ring structure. The chip includes that the outer seal ring, first seal ring arrangement, and second seal ring arrangement have matching layer-by-layer arrangements of alternating metal lines and metal vias disposed within respective layers of the dielectric layers.

Another embodiment is a semiconductor package including a first substrate, a plurality of low-k dielectric layers overlying the first substrate, a passivation layer overlying the plurality of low-k dielectric layers, the passivation layer including a non-low-k dielectric material, and a plurality of seal ring structures disposed in the plurality of low-k dielectric layers, where the plurality of seal ring structures include alternating layers of metal lines and metal vias. The package also includes a first group of dummy bumps including a plurality of dummy bump connectors, where the first group of dummy bumps is disposed over a top surface of the first substrate in a first corner of the first substrate, and the first corner is disposed immediately adjacent two intersecting edges of the first substrate. The package also includes a second group of dummy bumps including one or more dummy bump connectors, where the second group of dummy bumps is disposed over the top surface of the first substrate in a second corner of the first substrate, the second corner is disposed immediately adjacent two intersecting edges of the first substrate, and the first and second groups of dummy bumps are disposed in different corners of the first substrate. The package further includes a plurality of active bump connectors disposed over the top surface of the first substrate, an outer seal ring structure of the plurality of seal ring structures, the outer seal ring structure being disposed around a periphery of the first substrate, a first seal ring structure of the plurality of seal ring structures, and a second seal ring structure of the plurality of seal ring structures. The package includes that the first seal ring structure is disposed around the first group of dummy bumps, where the first seal ring structure encircles all of the first group of dummy bumps in top down view such that the first group of dummy bumps are disposed within a single continuous seal ring structure. The package also includes that the second seal ring structure is disposed around the second group of dummy bumps, where the second seal ring structure encircles all of the second group of dummy bumps in top down view such that the second group of dummy bumps are disposed within a single continuous seal ring structure. The package further includes that the passivation layer is interposed between the dummy bump connectors and the plurality of low-k dielectric layers, and that each the plurality of active bump connectors are electrically coupled to a corresponding device in the first substrate.

Another embodiment is a method including forming a semiconductor substrate, forming a plurality of low-k dielectric layers over the semiconductor substrate, and forming a plurality of seal rings. The method further includes forming a plurality of seal rings including: forming a plurality of seal ring metal lines in first alternating layers of the plurality of low-k dielectric layers, each of the plurality of seal ring metal lines forming a continuous loop around a corresponding seal ring region, and forming a plurality of seal ring metal vias in second alternating layers of the plurality of low-k dielectric layers, each of the second alternating layers interposed between alternate ones of the first alternating layers. The method also includes forming a first passivation layer over the plurality of low-k dielectric layers. The method also includes forming a first group of dummy bumps, where the first group of dummy bumps are disposed directly over a first seal ring region of the corresponding seal ring regions, and where the first group of dummy bumps including a plurality of dummy bump connectors, where each dummy bump of the first group of dummy bumps is electrically decoupled from the plurality of low-k dielectric layers by the first passivation layer. The method further includes forming a second group of dummy bumps, where the second group of dummy bumps is disposed directly over a second seal ring region of the corresponding seal ring regions, and where the second group of dummy bumps including one or more dummy bump connectors, where each dummy bump of the second group of dummy bumps is electrically decoupled from the plurality of low-k dielectric layers by the first passivation layer. The method also includes forming a group of active bumps, the group of active bumps being disposed directly over an outer seal ring region of the corresponding seal ring regions, and including one or more active bump connectors, where each of the active bump connectors is coupled to a device in the semiconductor substrate. The method also includes bonding the semiconductor substrate to another substrate to form a package, where the one or more dummy bumps is electrically coupled to a device in the other substrate, where the first seal ring region is disposed in a first corner of the package and the second seal ring region is disposed in a second corner of the package, and where a first number of dummy bumps in the first seal ring region is a different than a second number of dummy bumps in the second seal ring region.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising a chip, the chip comprising:
    a first group of dummy bumps comprising a plurality of dummy bump connectors, the first group of dummy bumps disposed at a top surface of the chip in a first corner of the chip, the first corner being disposed immediately adjacent two intersecting edges of the chip;
    a second group of dummy bumps comprising one or more dummy bump connectors, the second group of dummy bumps disposed at the top surface of the chip in a second corner of the chip, the second corner being disposed immediately adjacent two intersecting edges of the chip,
    wherein the first and second groups of dummy bumps are disposed in different corners of the chip;
    a plurality of active bump connectors disposed at the top surface of the chip, the plurality of active bump connectors and the first and second groups of dummy bumps arranged in a pattern in a top down view of the chip;
    an outer seal ring disposed around a periphery of the chip;
    a first seal ring arrangement disposed around the first group of dummy bumps;
    a second seal ring arrangement disposed around the second group of dummy bumps; and
    dielectric layers underlying the first and second groups of dummy bumps and the plurality of active bump connectors,
    wherein the first seal ring arrangement is disposed in the dielectric layers, the first seal ring arrangement encircling all of the first group of dummy bumps in top down view such that the first group of dummy bumps are disposed within a single continuous seal ring structure,
    wherein the second seal ring arrangement is disposed in the dielectric layers, the second seal ring arrangement encircling each dummy bump connector of the second group of dummy bumps in top down view such that each dummy bump is individually disposed within a corresponding separate seal ring structure,
    wherein the outer seal ring, first seal ring arrangement, and second seal ring arrangement have matching layer-by-layer arrangements of alternating metal lines and metal vias disposed within respective layers of the dielectric layers,
    wherein the first seal ring arrangement has a first shape defined by an outline of the first seal ring arrangement in top down view,
    wherein the first seal ring arrangement includes a first portion of the outer seal ring, and
    wherein the first shape comprises a first rounded portion, a second rounded portion, and a third rounded portion, the first rounded portion extending perpendicularly from the outer seal ring at a first edge of the first corner and bending toward a second edge of the first corner to be perpendicular to the second edge, the second rounded portion extending perpendicularly from the outer seal ring at the second edge of the first corner and bending toward the first edge of the first corner, the third rounded portion extending from the first rounded portion and bending toward the second rounded portion and away from the first edge of the first corner, the third rounded portion coupling the first rounded portion and the second rounded portion together.

2. The device of claim 1, wherein the second group of dummy bumps consists of one dummy bump connector, and wherein the second seal ring arrangement includes a portion of the outer seal ring.

3. The device of claim 1, further comprising:
    a third group of dummy bumps comprising one or more dummy bump connectors, the third group of dummy bumps disposed at the top surface of the chip in a third corner of the chip, the third corner being disposed immediately adjacent two intersecting edges of the chip, wherein the first, second, and third groups of dummy bumps are disposed in different corners of the chip; and
    a third seal ring arrangement disposed around the third group of dummy bumps, the third seal ring arrangement disposed in the dielectric layers, the third seal ring arrangement encircling all of the third group of dummy bumps in top down view such that the third group of dummy bumps are disposed within a single continuous seal ring structure, wherein the third seal ring arrangement has a third shape defined by an outline of the third seal ring arrangement in top down view, wherein the first shape is different than the third shape.

4. The device of claim 3, wherein the third seal ring arrangement includes a third portion of the outer seal ring.

5. The device of claim 4, wherein the third seal ring arrangement includes a fourth portion that extends from the outer seal ring at a third edge of the chip of the third corner to the outer seal ring at a fourth edge of the chip of the third corner.

6. The device of claim 5, wherein the fourth portion has a curved edge in top down view.

7. The device of claim 6, wherein the third seal ring arrangement includes a third portion that extends from the outer seal ring adjacent the second edge of the chip to the outer seal ring adjacent a third edge of the chip, the second edge of the chip being adjacent to the third edge of the chip, wherein the third portion includes a first segment and a second segment which have outlines in top down view that are perpendicular to each other.

8. The device of claim 3, further comprising:
a fourth group of dummy bumps comprising one or more dummy bump connectors, the fourth group of dummy bumps disposed at the top surface of the chip in a fourth corner of the chip, the fourth corner being disposed immediately adjacent two intersecting edges of the chip, wherein the first, second, third and fourth groups of dummy bumps are disposed in different corners of the chip; and
a fourth seal ring arrangement disposed around the fourth group of dummy bumps, the fourth seal ring arrangement disposed in the dielectric layers, the fourth seal ring arrangement encircling all of the fourth group of dummy bumps in top down view such that the fourth group of dummy bumps are disposed within a single continuous seal ring structure,
wherein the fourth seal ring arrangement has a fourth shape defined by an outline of the fourth seal ring arrangement in top down view, wherein the first shape is different than the fourth shape.

9. A semiconductor package comprising
a first substrate,
a plurality of low-k dielectric layers overlying the first substrate;
a passivation layer overlying the plurality of low-k dielectric layers, the passivation layer comprising a non-low-k dielectric material;
a plurality of seal ring structures disposed in the plurality of low-k dielectric layers, the plurality of seal ring structures comprising alternating layers of metal lines and metal vias;
a first group of dummy bumps comprising a plurality of dummy bump connectors, the first group of dummy bumps disposed over a top surface of the first substrate in a first corner of the first substrate, the first corner being disposed immediately adjacent two intersecting edges of the first substrate, wherein a portion of the plurality of low-k dielectric layers directly underlying the first group of dummy bumps includes a crack;
a second group of dummy bumps comprising one or more dummy bump connectors, the second group of dummy bumps disposed over the top surface of the first substrate in a second corner of the first substrate, the second corner being disposed immediately adjacent two intersecting edges of the first substrate,
wherein the first and second groups of dummy bumps are disposed in different corners of the first substrate;
a plurality of active bump connectors disposed over the top surface of the first substrate;
an outer seal ring structure of the plurality of seal ring structures, the outer seal ring structure disposed around a periphery of the first substrate;
a first seal ring structure of the plurality of seal ring structures, the first seal ring structure disposed around the first group of dummy bumps in the plurality of low-k dielectric layers, wherein the first seal ring structure encircles all of the first group of dummy bumps in top down view such that the first group of dummy bumps are disposed within a single continuous seal ring structure, wherein the crack does not propagate beyond the first seal ring structure; and
a second seal ring structure of the plurality of seal ring structures, the second seal ring structure disposed around the second group of dummy bumps in the plurality of low-k dielectric layers, wherein the second seal ring structure encircles all of the second group of dummy bumps in top down view such that the second group of dummy bumps are disposed within a single continuous seal ring structure,
wherein the passivation layer is interposed between the dummy bump connectors and the plurality of low-k dielectric layers, and
wherein each the plurality of active bump connectors are electrically coupled to a corresponding device in the first substrate.

10. The semiconductor package of claim 9, further comprising:
a second substrate comprising a feature, the feature including devices, metal lines, or vias, the second substrate bonded to the first substrate, wherein one of the one or more dummy connectors is electrically coupled to the feature of the second substrate.

11. The semiconductor package of claim 9, wherein the plurality of seal ring structures comprises aluminum and extends into the passivation layer.

12. The semiconductor package of claim 9, wherein the first seal ring structure has a first shape in plan view, wherein the second seal ring structure has a second shape in plan view, wherein the first shape is different than the second shape, wherein the first shape is the same as the second shape when the first shape is rotated.

13. The semiconductor package of claim 9, wherein the first seal ring structure has a first shape in plan view, wherein the second seal ring structure has a second shape in plan view, wherein the first shape has an edge in plan view which is non-parallel to any of the edges of the first substrate, wherein each of the edges of the second shape are parallel or perpendicular to all of the edges of the first substrate.

14. The semiconductor package of claim 13, wherein the first seal ring structure includes a portion of the outer seal ring structure, and wherein the second seal ring structure includes a portion of the outer seal ring structure.

15. A semiconductor package comprising
a first substrate,
a plurality of low-k dielectric layers overlying the first substrate;
a passivation layer overlying the plurality of low-k dielectric layers, the passivation layer comprising a non-low-k dielectric material;

a plurality of seal ring structures disposed in the plurality of low-k dielectric layers, the plurality of seal ring structures comprising alternating layers of metal lines and metal vias;

a first group of bumps comprising a plurality of dummy bump connectors, the first group of bumps disposed over a top surface of the first substrate in a first corner of the first substrate;

a second group of bumps comprising one or more dummy bump connectors, the second group of bumps disposed over the top surface of the first substrate in a second corner of the first substrate, the second corner being a different corner than the first corner;

a third group of bumps comprising one or more dummy bump connectors, the third group of bumps disposed over the top surface of the first substrate in a third corner of the first substrate, the third corner being a different corner than the first corner and the second corner;

a fourth group of bumps comprising one or more dummy bump connectors, the fourth group of bumps disposed over the top surface of the first substrate in a fourth corner of the first substrate, the fourth corner being a different corner than the first corner, the second corner, and the third corner;

a fifth group of bumps comprising one or more active bump connectors, the fifth group of bumps disposed over the top surface of the first substrate;

an outer seal ring structure of the plurality of seal ring structures, the outer seal ring structure disposed around a periphery of the first substrate, the outer seal ring structure encircling all of the first group of bumps, second group of bumps, third group of bumps, fourth group of bumps, and fifth group of bumps;

a first seal ring structure of the plurality of seal ring structures, the first seal ring structure disposed around the first group of bumps, wherein the first seal ring structure encircles all of the first group of bumps in top down view such that the first group of bumps are disposed within a single continuous seal ring structure, the first seal ring structure having a first shape in plan view, the first shape including a first side and a second side, the first side and the second side each coinciding with two different sides of the outer seal ring structure and a third side coupling the first side to the second side, wherein the third side consists of a curved line in plan view;

a second seal ring structure of the plurality of seal ring structures, the second seal ring structure disposed around the second group of bumps, wherein the second seal ring structure encircles all of the second group of bumps in top down view such that the second group of bumps are disposed within a single continuous seal ring structure, the second seal ring structure having a second shape in plan view, the second shape including a fourth side and a fifth side, the fourth side and the fifth side each coinciding with two different sides of the outer seal ring structure, and a sixth side coupling the fourth side to the fifth side, wherein the sixth side consists of a combination of curved lines and straight lines in plan view;

a third seal ring structure of the plurality of seal ring structures, the third seal ring structure having a third shape in plan view; and a fourth seal ring structure of the plurality of seal ring structures, wherein the fourth seal ring structure has a fourth shape in plan view, wherein the passivation layer is interposed between the dummy bump connectors and the plurality of low-k dielectric layers, and wherein each the one or more active bump connectors are electrically coupled to a corresponding device in the first substrate.

16. The semiconductor package of claim 15, wherein the first shape has an edge in plan view which is non-parallel to any edge of the first substrate, and wherein the fourth shape is the same as the third shape when the fourth shape is rotated.

17. The semiconductor package of claim 15, wherein the plurality of seal ring structures comprises aluminum copper and extends into the passivation layer.

18. The semiconductor package of claim 15, further comprising:
a delamination in the plurality of low-k dielectric layers directly underlying the first group of bumps, wherein the delamination does not propagate beyond the first seal ring structure.

19. The device of claim 1, further comprising:
a crack in the dielectric layers directly underlying the first group of dummy bumps, wherein the crack does not propagate beyond the first seal ring arrangement.

20. The semiconductor package of claim 9, wherein the first seal ring structure has a first shape in plan view, the first shape comprising a first rounded portion, a second rounded portion, and a third rounded portion, the first rounded portion extending from a first line perpendicular to the outer seal ring structure at a first edge of the first corner and bending toward a second edge of the first corner to be perpendicular to the second edge, the second rounded portion extending from a second line perpendicular to the outer seal ring structure at the second edge of the first corner and bending toward the first edge of the first corner to be perpendicular to the first edge, the third rounded portion extending from the first rounded portion and bending toward the second rounded portion and away from the first edge of the first corner, the third rounded portion coupling the first rounded portion and the second rounded portion together.

* * * * *